(12) United States Patent
Gehrmann et al.

(10) Patent No.: US 6,455,893 B1
(45) Date of Patent: Sep. 24, 2002

(54) MOS TRANSISTOR WITH HIGH VOLTAGE SUSTAINING CAPABILITY AND LOW ON-STATE RESISTANCE

(75) Inventors: Andreas Gehrmann, Dortmund; Ralf Bornefeld, Schalksmuehle, both of (DE)

(73) Assignee: ELMOS Semiconductor AG, Dortmund (DE)

( * ) Notice: Subject to any disclaimer, the term of this patent is extended or adjusted under 35 U.S.C. 154(b) by 0 days.

(21) Appl. No.: 09/339,221

(22) Filed: Jun. 24, 1999

(30) Foreign Application Priority Data

Jun. 26, 1998 (DE) .......................................... 198 28 522

(51) Int. Cl.⁷ .............................................. H01L 29/76
(52) U.S. Cl. ...................................... 257/339; 257/409
(58) Field of Search ................................ 257/367, 409, 257/339

(56) References Cited

U.S. PATENT DOCUMENTS

| | | | |
|---|---|---|---|
| 5,086,332 A | 2/1992 | Nakagawa et al. | 257/409 |
| 5,811,854 A | 9/1998 | Iwabuchi et al. | 257/367 |
| 5,889,310 A | 3/1999 | Terashima et al. | 257/409 |
| 5,959,330 A | 9/1999 | Tokuyama et al. | 257/409 |
| 6,153,916 A | * 11/2000 | Roth et al. | 257/409 |
| 6,172,406 B1 | * 1/2001 | Nguyen | 257/408 |

FOREIGN PATENT DOCUMENTS

JP 53-60181 * 5/1978

* cited by examiner

Primary Examiner—Sara Crane

(57) ABSTRACT

The MOS transistor with high voltage sustaining capability and low closing resistance comprises a substrate doped with charge carriers of a first line type. In the substrate drain and source regions are configured doped with charge carriers of a second line type opposed to the first line type. Further, the MOS transistor is provided with a gate electrode arranged in the region between the drain and the source regions on the substrate and comprising a drain-side end region. A drain extension region is doped with charge carriers of the second line type, connected with the drain region and extends to below the drain-side end of the gate electrode. The drain extension region is produced by an ion implantation process comprising at least a first implantation step. The drain extension region comprises in its region near the top side and facing the top side of the substrate a lower doping material concentration than in its region below the region near the top side.

8 Claims, 2 Drawing Sheets

MOS TRANSISTOR WITH HIGH VOLTAGE SUSTAINING CAPABILITY AND LOW ON-STATE RESISTANCE

BACKGROUND OF THE INVENTION

The invention relates to a MOS transistor with low closing resistance, in particular for the voltage range from 20–30 V (medium voltage NMOS).

The presently used HV NMOS transistors with a cut-off voltage of up to approximately 150 volts are uneconomical in terms of surface area because of the voltage-optimized design for voltage ranges of about 20 volts. The diffused n-well used here as drain extension (FIG. 1), also in connection with a field plate (FIG. 2), represents the classical approach to increase the voltage sustaining capability. Since the doping of this n-well is configured in such a way that it is suitable to accept the complementary transistor (PMOS), its doping lies on a lower level. When the n-well is used as drain extension, it exerts a limiting effect on the performance of the transistor with regard to the current yield.

While the existing NMOS-logic transistor, on the other hand, is optimized in terms of the current yield, it does, not possess the necessary voltage sustaining capability.

In CMOS processes HV transistors for voltages of more than 30 volts may be realized in addition to the logic transistors for the 5-volt voltage range. These are optimized for peak voltages of 30/40/50 volts normally applied in the automotive range but also to promote suppression of interference pulses of up to approximately 150 volts. The voltage range from 10 volts to 30 volts, too, is at present covered by such HV transistors since special transistors do not exist. Higher performance and thus saving of surface area are to be achieved using specially optimized transistors for this voltage range.

An important boundary condition for design of the new MOS transistor is the CMOS process which is not to be modified or extended. The production of the new MOS transistor may not have any influence on the existing components and their parameters.

In conventional CMOS processes of up to approximately 1.0 $\mu$m there are no possibilities of realising the new components without modifying the process and thus inducing modifications of the parameters of existing components. The reason for this phenomenon is the well design optimized in terms of high-voltage features since the logic transistors are produced in the high-voltage wells and there is thus no possibility of separately optimizing the logic and hiah-voltage portions.

In typical submicron technologies, i. e. mostly mixed technologies where logic and high-voltage components can be separately optimized, new wells are available besides the previously used well doping regions, which accept new complementary logic transistors with reduced gate oxide (so-called low-voltage transistors). These low-voltage wells are suitable for realization of the desired component.

SUMMARY OF THE INVENTION

An object of the invention is to create a MOS transistor having a low on-state resistance at high voltage sustaining capability and being producible by means of the process steps for logic MOS transistors.

To solve this object the present invention suggests a MOS transistor with high voltage sustaining capability and low closing resistance, which comprises a substrate doped with charge carriers of a first line type, drain and source regions configured in the substrate, which are doped with charge carriers of a second line type opposed to the first line type, a gate electrode arranged in the region between the drain and the source region on the substrate and comprising a drain-side end region, a drain extension region doped with charge carriers of the second line type, connected with the drain region and extending to below the drain-side end of the gate electrode.

This MOS transistor according to the present invention is characterized in that the drain extension region is produced by an ion implantation process comprising at least one first implantation step, and the drain extension region comprises in its region located near the top side and facing the top side of the substrate a lower doping material concentration than in its region below the region located near the top side.

In the MOS transistor according to the invention the drain extension region required to increase the voltage sustaining capability is produced by an ion implantation step with the implantation comprising a lower doping material concentration in its region located near the top side and facing the top side of the substrate than in its region below the region located near the top side. In other words, the drain extension region comprises a so-called retrograde profile. This offers the advantage that an implanted retrograde well can be a drain extension as is used for low-voltage transistors (logic transistors) in typical submicron technologies. Thus process steps can be applied for the production of the MOS transistor according to the present invention, which are presently applied to the production of integrated low-voltage MOS logic transistors. The process control thus remains unchanged and, what is of particular importance, is not extended by additional process steps. The thermal balance also remains unchanged.

In a preferred embodiment of the present invention it is further envisaged to realize the drain extension region by means of a two or three-step implantation process with the ion implantations applied to low-voltage transistors being used as second and/or third implantations for threshold value adjustment and prevention of a punch through effect.

Another advantage of the MOS transistor according to the present invention is the achievement of an increased performance with reduced surface area requirement. The current yield of the HV transistor according to the present invention is improved whereas the voltage sustaining capability is limited to a certain extent due to the less smooth doping patterns in the corner regions of the retrograde implantation profile. However, the voltage sustaining capability is sufficient to meet the requirements applicable to automotive application so that for the transistor according to the present invention above all the surface area saving proves an asset.

The essential innovation presented by the MOS transistor according to the present invention thus is the use of a retrograde well profile to produce a drain extension so that retrograde wells optimized for the low-voltage logic transistors can be used as drain extension for high-voltage components, which results in both an unchanged and simple process control without additional steps.

Contrary to the classical process for production of a diffused drain extension to improve the voltage sustaining capability an implanted retrograde doping profile is used according to the present invention. This profile comprises 1 to 3 implantations depending on the process control applied:

the well implantation (WI) proper, high-energy implanted at a large depth of >1 μm, possibly the VT implantation (VTI) near the surface to adjust the closing threshold (threshold value adjustment) and/or possibly an anti-punch through implantation (APTI) approximately at the depth or the drain/source regions (<0.5 μm) which limits the expansion of the space charge region on the drain towards the source.

The implantations (WI and APTI) are masked by the field oxide and thus only reach the active regions. The WI penetrates the field oxide and forms a high-doped layer immediately thereunder in depth direction. Combination of both in a component with field plate as is envisaged according to a preferred embodiment of the present invention results in the following advantages/disadvantages as compared with the classical process:

In the active region below the gate particularly the APTI prevents an increased field at the field oxide fringe since it decreases the doping gradient of the drain well. This improves the voltage sustaining capability.

In the region below the field plate, the WI produces a low-ohm connection of the drain to the channel. This has a positive effect on the current yield of the transistor and represents the essential improvement as compared with the classical process.

The less smooth doping patterns in the corners of the retrograde implantation profile limit the voltage sustaining capability achievable at maximum. It thus typically lies below the values achievable by means of the classical method:

Further, when using the implantation profile described above, a component without field plate could possibly be employed. When using this component a smaller surface area is required at reduced voltage sustaining capability with the same advantages being made use of.

Another increase in the voltage sustaining capability is feasible with a so-called "modulated well implantation" (PCT application PCT/EP96/04246, publication no. WO-A-97/13277). This method is also applicable to She components described above which is the reason why the contents of the PCT application has been made the subject matter of the present application.

It must be said here that the new components described herein cannot only be realized as n-channel transistor. A p-channel transistor is also feasible by using the p-low-voltage well as drain extension inside the existing HV-n-well as body.

BRIEF DESCRIPTION OF THE DRAWINGS

Hereunder embodiments of the present invention are explained in detail with reference to the drawings in which.

DESCRIPTION OF THE PREFERRED EMBODIMENT

Figure 1:
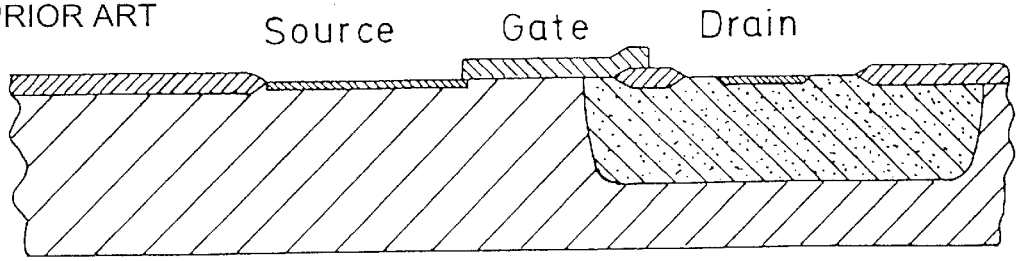
FIG. 1 shows a section of a state-of-the-art HV-NMOS transistor with diffused drain extension region and field plate below the drain-side edge of the gate electrode.
Figure 2:
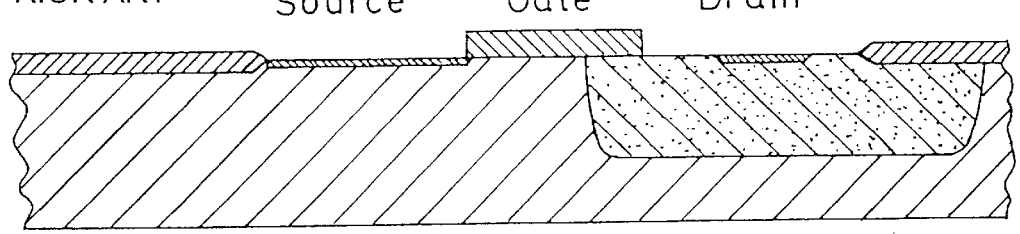
FIG. 2 shows a section of a state-of-the-art HV-NMOS transistor with diffused drain extension region without field plate.
Figure 3:
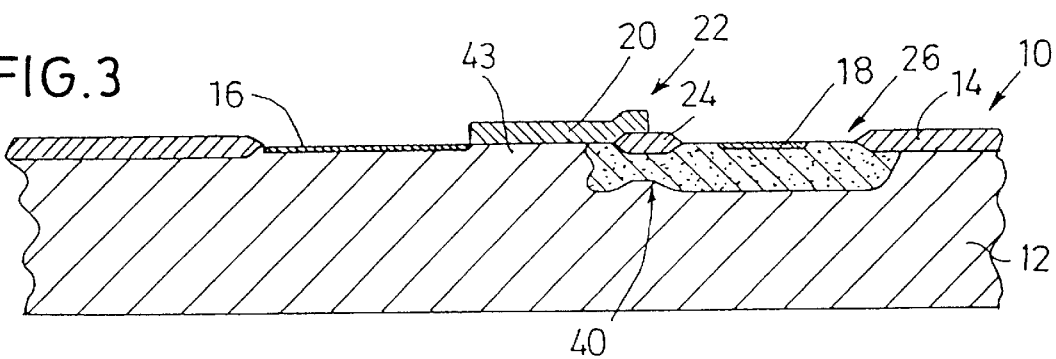
FIG. 3 shows a section of the MOS transistor according to the present invention with implanted drain extension region and field plate.

FIG. 3 shows a longitudinal section of a first embodiment of the MOS transistor 10 according to the present invention, which is an NMOS transistor. The MOS transistor 10 is configured in a p-doped substrate 12 whose active region is defined by an opening in a field oxide layer 14. The NMOS transistor 10 comprises degenerated n-doped source and drain regions 16, 18 between which a gate electrode 20 is arranged. The gate electrode 20 comprises a drain-side end region 22 facing the drain region 18 with a field plate 24 of silicon oxide being arranged below the end region.

Figure 6:
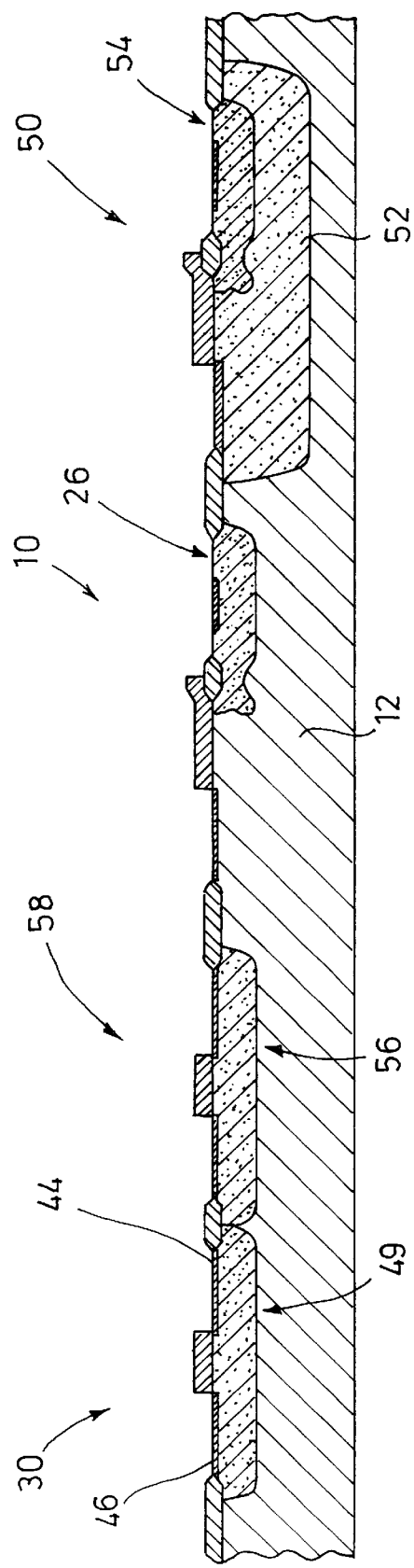
FIG. 6 shows a section of a substrate in which two logic low-voltage transistors are shown besides the two HV-MOS transistors according to the present invention.

The drain region 18 is located in a drain extension region 26 which is produced by ion implantation. Such ion implantation is that type of implantation which is also used to configure a well within the substrate 12, within which an NMOS low-voltage logic transistor is configured. Such a logic transistor is shown in FIG. 6 at 30.

Figure 5:
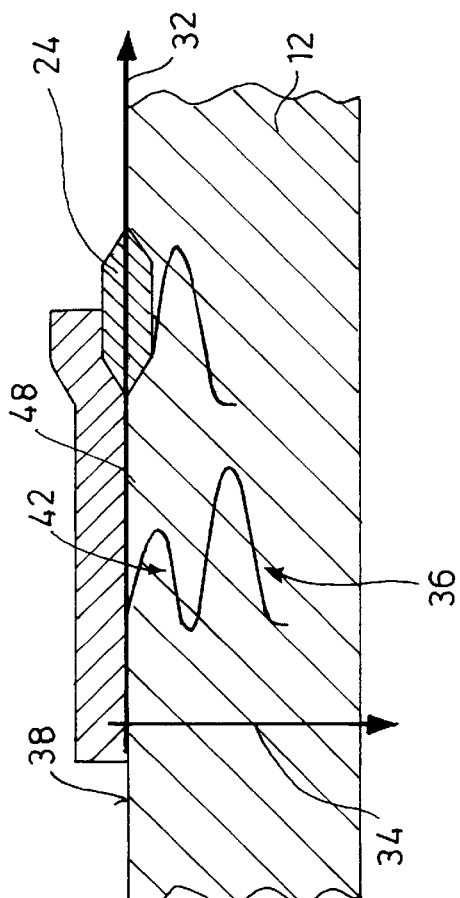
FIG. 5 shows a representation of the doping material concentration as a function of the depth of the implantation of the drain extension region below the gate electrode and below the field plate.

The drain extension region 26 is n-doped and comprises a doping concentration which grows with increasing depth. In this way a retrograde well profile is produced which is shown in FIG. 5. In this figure the doping material concentration is displayed along the axis 32 over the depth plotted along the axis 34. The doping material concentration profile 36 which is configured at a distance from the substrate surface 38 in the near-surface region of the substrate 12 is due to the implantation process Lo place a well region in the substrate with such a sell region also being required for configuration of the logic transistor 30. The field plate 24 already configured when such an implantation is carried out ensures that below the field plate 24 the implantion does penetrate into the substrate 12 as deep as outside the field plate 24. This is shown in FIG. 3 by the recess 40 at the bottom of the drain extension region 26. In addition to this first implantation step a second implantation step for transistor 10 according to FIGS. 3 and 5 is effected, i. e. the implantation step to realize an anti-punch-through implantation. The resultant doping material concentration profile is shown in FIG. 5 at 42. This implantation step is less energy-rich than that described and carried out first which is the reason why the doping material concentration profile 42 in the region between the profile 36 and the substrate surface 28 is configured with the energy being so low that the ion implantation does not penetrate the field plate 24 and thus is realized merely below the gate electrode 20. This anti-punch-through implantation is required at the logic transistor 30 to limit an expansion of the space charge region of the drain region 44 of the logic transistor 30 towards the source region 46.

A further ion implantation step can be carried out, i. e. for adjustment of the closing threshold (threshold value adjustment) of the logic transistor 30. This implantation step, too, is realized in the drain extension region 26 with the resultant doping material concentration exerting an effect on the substrate surface 38. In FIG. 5 the resultant doping material concentration profile is not shown.

Altogether the drain extension region 26 of the HV transistor 10 is thus produced by carrying out up to three implantation steps with a doping material concentration 48, which grows with increasing depth, being produced within the channel region. Owing to the well implantation immediately below the field plate 24 the low-ohm connection of the drain extension region 26 to the channel region 48 is effected.

Figure 4:
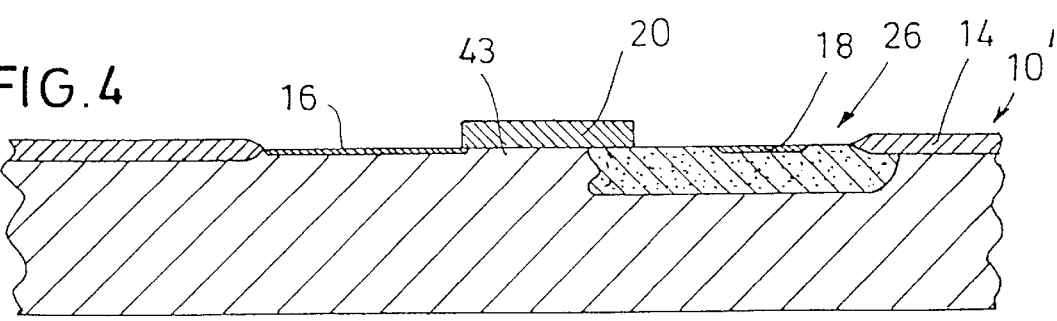
FIG. 4 shows a section of the MOS transistor according to the present invention in accordance with another embodiment with implanted drain extension region without field plate.

FIG. 4 shows an alternative embodiment of an NMOS transistor 10', which is identical with the NMOS transistor 10 of FIG. 3 except for the field plate 24. In the embodiment according to FIG. 4 this field plate 24 is omitted; this effects the doping material concentration distribution within the drain extension region 26 which finally results in a slight reduction of the voltage sustaining capability of the transistor 10' as compared with the voltage sustaining capability of the transistor 10. Further, a retrograde doping profile is produced within the region 26 owing to the presence of the field plate 24, which results in the current flow between the channel region 48 below the gate electrode 20 and the drain region 18 not exclusively taking place at the surface but mainly in the volume of the drain extension region 26, i. e. in its depth. The advantage is that the current conduction is not affected by surface effects and is thus more reliable and reproducible.

FIG. 6 shows the configuration of logic transistors and HV transistors according to the present invention with one and the same substrate 12. It can be seen that the drain extension region 26 of the HV-NMOS transistor 10 is also used as active region 49 for the logic NMOS transistor 30. If the invention is employed for an HV-PMOS transistor 50 which is configured within an HV-n-well 52 of the substrate 12, the drain extension region 54 of this HV-PMOS transistor 50 corresponds to the well 56 of a logic PMOS transistor 58 integrated in the p-substrate 12.

What is claimed is:

1. An MOS transistor with high voltage sustaining capability and low on-state resistance suitable for formation on a substrate with logic transistors, comprising:
   a substrate doped with charge carriers of the first conductivity type;
   drain and source regions configured in the substrate, doped with charge carriers of a second conductivity type opposed to the first conductivity type;
   a gate electrode arranged on the substrate in the region between the drain and the source region and comprising a drain-side end region;
   a drain extension region doped with charge carriers of the second conductivity type, connected with the drain region and extending below the drain-side end of the gate electrode said drain extension region being produced by an ion implantation process having at least one first implantation step, wherein the first implantation step is also used to configure active regions for logic transistors in the substrate;
   said drain extension region having a doping material concentration which increases with increasing depth from an upper surface of said transistor.

2. The MOS transistor according to claim 1, further comprising a field oxide plate arranged below the drain-side end of the gate electrode.

3. The MOS transistor according to claim 1, wherein the ion implantation process comprises a second implantation step which allows ions implantation at an energy which is lower than the energy of the first implantation step to be realized in the substrate.

4. The MOS transistor according to claim 3, wherein the implantation in the second implantation step is also used for threshold value adjustment of the logic transistors configured on the substrate.

5. The MOS transistor according to claim 1, wherein the ion implantation process comprises a third implantation step performing implantation at an energy lying between the energies of the implantations of the first and the second implantation steps.

6. The MOS transistor according to claim 5, wherein the ion implantation realized with the third implantation step is also used as anti-punch-through implantation for logic transistors configured on the substrate.

7. The MOS transistor according to claim 2, wherein the field oxide plate masks each implantation supplied at an energy which is lower than the energy of the implantation realized with the first implantation step so that below the field oxide plate only ion implantation realized with the first implantation step is arranged.

8. The MOS transistor according to claim 1, wherein the high voltage MOS transistor is produced by the same process steps used to produce the logic transistors.

* * * * *